United States Patent [19]
Matsutomo

[11] Patent Number: 5,982,025
[45] Date of Patent: Nov. 9, 1999

[54] WIRE FIXATION STRUCTURE

[75] Inventor: Mitsuhiro Matsutomo, Kumamoto, Japan

[73] Assignee: NEC Corporation, Tokyo, Japan

[21] Appl. No.: 08/864,828

[22] Filed: May 29, 1997

[30] Foreign Application Priority Data

May 30, 1996 [JP] Japan .................................. 8-136681

[51] Int. Cl.⁶ ................................................ H01L 23/495

[52] U.S. Cl. ........................................... 257/666; 257/676

[58] Field of Search .................................. 257/666, 668, 257/676, 667, 691

[56] References Cited

U.S. PATENT DOCUMENTS

4,801,999  1/1989  Hayward et al. ........................ 257/668
5,723,899  3/1998  Shin ........................................ 257/666

Primary Examiner—Carl Whitehead, Jr.
Assistant Examiner—Roy Potter
Attorney, Agent, or Firm—Helfgott & Karas, PC

[57] ABSTRACT

A lead structure includes an insulating film, a plurality of leads, and a plurality of adhesive layers separately provided on the insulating film. Two adjacent leads are fixed by adjacent adhesive layers, respectively, such that an adhesive does not exist on the insulating film between the adjacent adhesive layers. Therefore, ion migration between the leads through the adhesive layer can be prevented.

17 Claims, 10 Drawing Sheets

103' ADHESIVE SHEET

102 INSULATING TAPE LAYER
103 ISOLATED ADHESIVE LAYERS
LEADS

FIG.8    301a : POWER LEAD
301b : GROUND LEAD

WIRE FIXATION STRUCTURE

BACKGROUND OF THE INVENTION

1. Field of the Invention

The present invention relates to fixation of conductors arrayed with high density, and more particularly to a lead structure such as a taped lead frame or a tape carrier for connection of a semiconductor chip.

2. Description of the Related Art

In recent years, for the high integration and large capacity of an IC chip, especially for LSI and VLSI chips, packages for mounting a semiconductor chip are reduced in size and have a great number of pins, and the spacing between leads on the lead frame has become narrower and narrower. In the case where a semiconductor chip such as this is hermetically sealed within molded resin, there is adopted a method which tapes and fixes the leads of the lead frame.

Figure 1A:
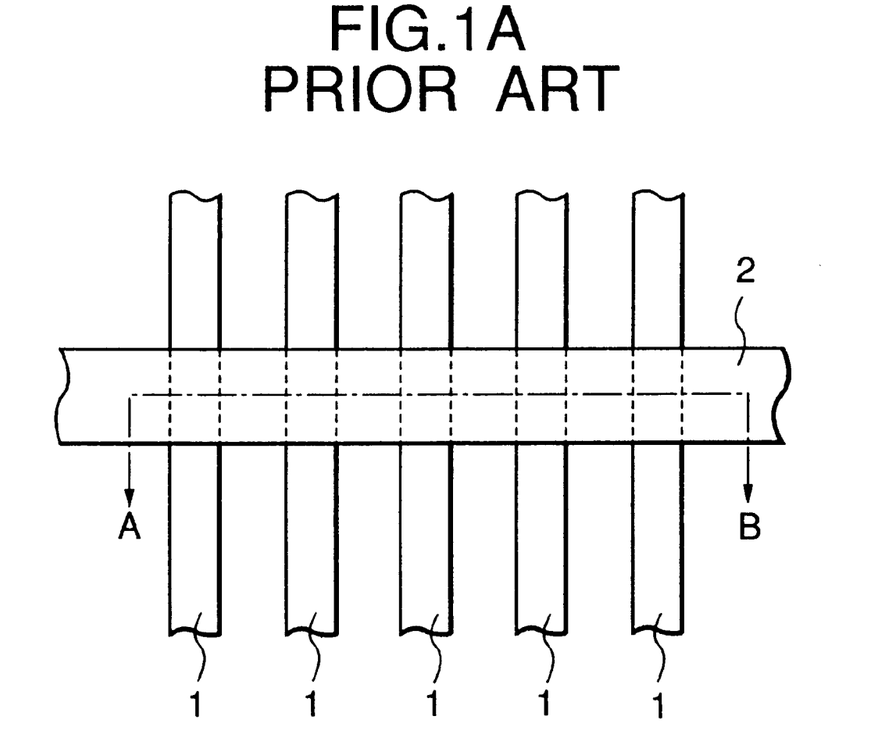
FIG. 1A is a plan view showing a conventional lead frame.
Figure 1B:
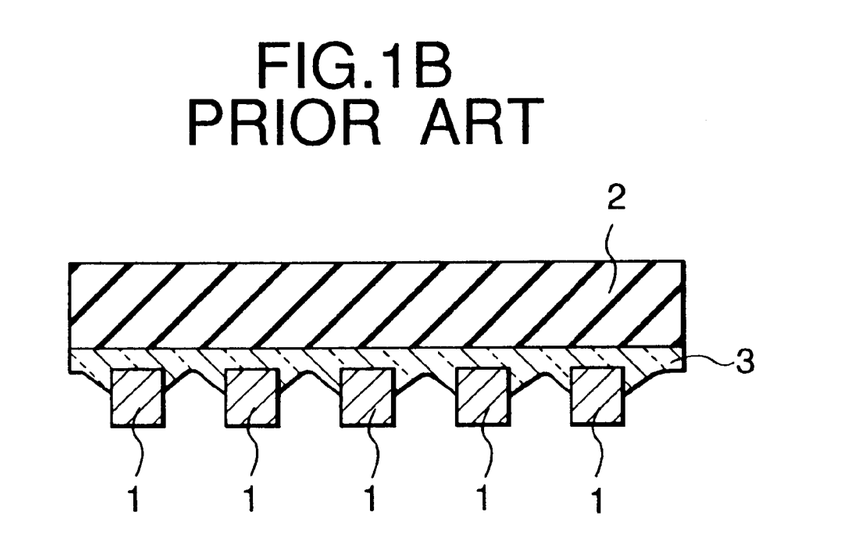
FIG. 1B is a sectional view of the conventional lead frame taken substantially along line A–B of FIG. 1A.

As shown in FIGS. 1A and 1B, an insulating tape layer 2 is bonded to a plurality of leads 1 made of copper (Cu) through an adhesive layer 3, and a taped lead frame is formed. This conventional taped lead frame has a structure where the adhesive layer 3 is formed on the entire surface of the insulating tape layer 2 and thereby a plurality of narrow-pitch leads 1 are fixed.

Figure 1C:
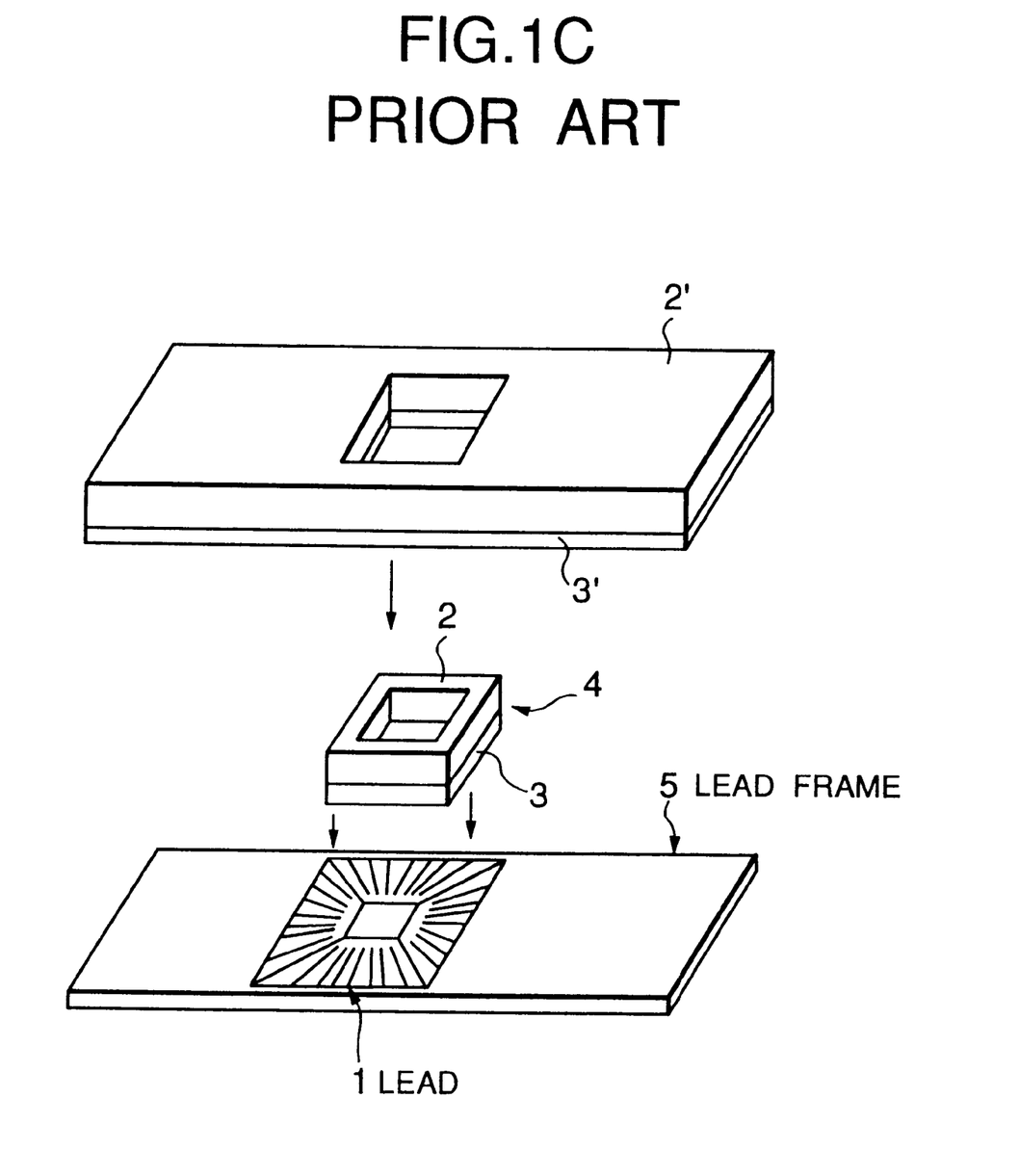
FIG. 1C is a perspective view used to explain how the lead frame of FIG. 1A is fabricated.

The taping of a lead frame is carried out as shown in FIG. 1C. That is, an insulating sheet 3' having a adhesive sheet 2' formed on its one side is punched to form tape 4 in a shape which corresponds to the array configuration of the leads 1 of a lead frame 5. The tape 4 consists of the insulating tape layer 2 and the adhesive layer 3. The tape 4 is heated and then is bonded to the leads 1. In this way, the leads 1 are fixed as shown in FIGS. 1B.

SUMMARY OF THE INVENTION

The inventor, however, has found that the aforementioned conventional lead frame gives rise to an ion migration phenomenon where copper (Cu) migrates from a lead to the adjacent lead through the adhesive layer 3. If a large amount of Cu flows into the adhesive layer 3 between adjacent leads due to the ion migration phenomenon, there are cases where leakage current will increase between the adjacent leads and finally short circuit will arise.

Ion migration such as this is accelerated by the moisture contained in the adhesive material. That is, if Cu reacts with this moisture and is ionized and if Cu ions flow into the adhesive layer 3, two adjacent leads act as if they are the electrodes of a battery and therefore flow of Cu is accelerated.

Also, in the IC package of the resin seal type where a semiconductor chip is mounted on a conventional lead frame, if the adhesion between the adhesive layer and the molded resin is degraded, water will stay in the gap. In such a case, Cu will flow into the water and leakage current will occur between adjacent leads. it is a matter of course that such leakage current and short circuit result in device failure.

Accordingly, it is an object of the present invention to provide a taped lead structure for chip connection with high reliability.

Another object of the present invention is to provide a taped lead structure which are capable of preventing an ion migration between leads.

According to the present invention, a lead structure includes an insulating film, a plurality of leads, and a plurality of adhesive layers separately provided on the insulating film, wherein two adjacent leads are fixed by adjacent adhesive layers, respectively, such that an adhesive does not exist on the insulating film between the adjacent adhesive layers.

Since adhesive layers are isolated from each other and formed in the shape of an island and no adhesive exists between the adjacent leads, the ion migration between the leads through the adhesive layer can be prevented.

BRIEF DESCRIPTION OF THE DRAWINGS

The present invention will be described in further detail with reference to the accompanying drawings, in which.

DETAILED DESCRIPTION OF THE PREFERRED EMBODIMENTS

FIRST EMBODIMENT

Figure 2A:
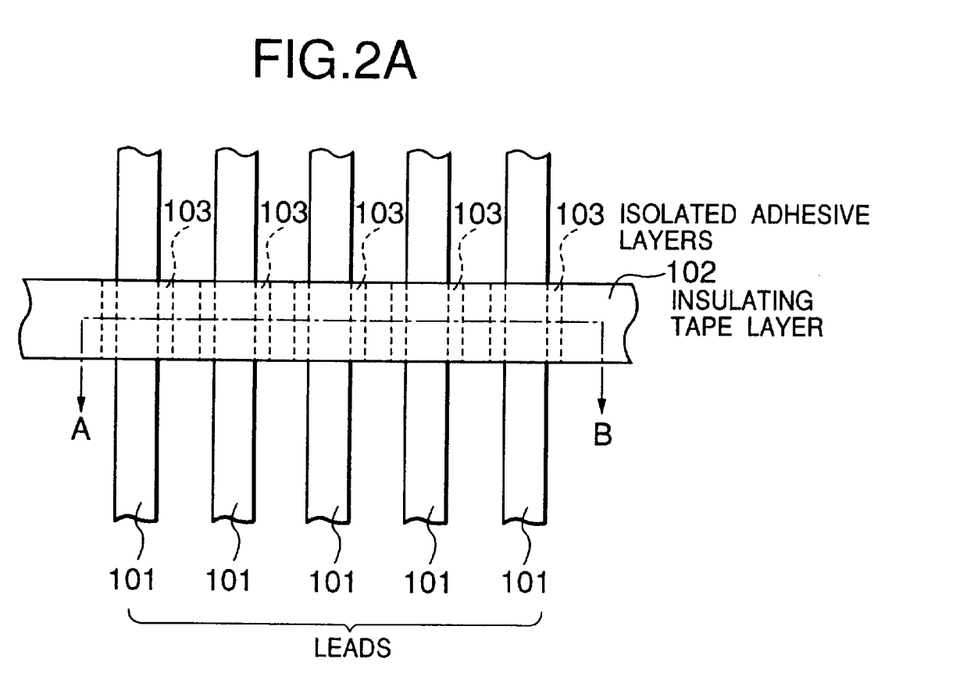
FIG. 2A is a plan view showing a lead frame according to a first embodiment of the present invention.
Figure 2B:
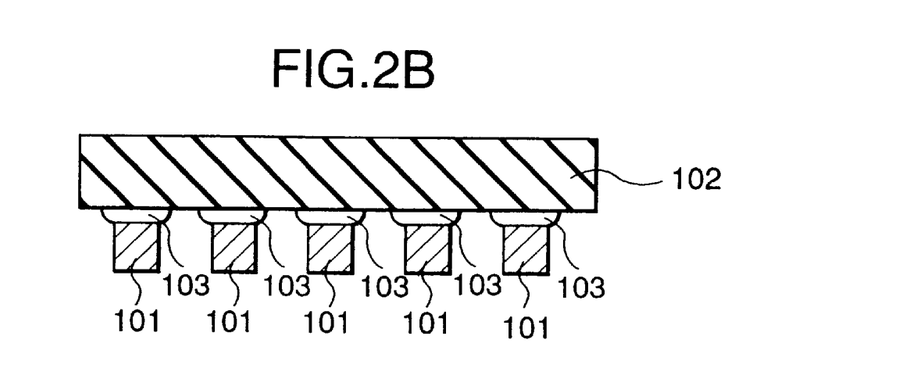
FIG. 2B is a sectional view of the lead frame in FIG. 2A taken substantially along line A–B of FIG. 2A.

Referring to FIGS. 2A and 2B, there is shown a lead frame according to a first embodiment of the present invention. In the figures, the respective leads 101 of the lead frame are bonded to an insulating tape layer 102 through adhesive layers 103 isolated from each other. The material of the lead frame is composed of metal, and in this embodiment, it is copper (Cu) plated with silver (Ag) or an alloy plated with Ag. The spacing between the leads 101 is about 0.1 to 0.2 mm. Then, the insulating tape layer 102, as with the aforementioned conventional tape layer, is formed from an organic insulator such as polyimide.

The leads 101 of the lead frame, shown in FIG. 2B, are bonded to the insulating tape layer 102 through the isolated adhesive layers 103 formed separately in the shape of an island in correspondence with the leads 101, respectively. In this embodiment, the isolated adhesive layers 103 employ thermosetting material, as described later. For example, each adhesive layer 103 is constituted by phenol resin or a mixture of 50% of phenol resin and 50% of acrylonitrile-butadiene rubber (NBR). In this manner, contact between adjacent leads is prevented.

Figure 3A:
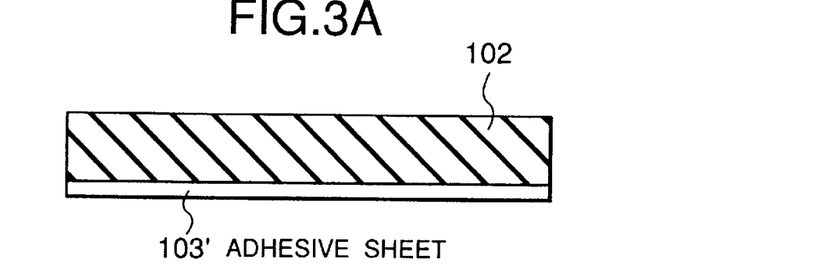
FIGS. 3A through 3D are sectional views used to explain how the lead frame according to the first embodiment of the present invention is fabricated in accordance with a first fabrication method.

As shown in FIG. 3A, the lead frame of the first embodiment of the present invention is formed in accordance with a first fabrication method. An adhesive sheet 103' is formed on one side of the insulating tape layer 102. In this embodiment, the adhesive sheet 103' is phenol resin with a film thickness of about 20 $\mu$m and is formed as follows. That is, a coating of phenol resin is applied over one side of the insulating tape layer 102 of polyimide. A press sheet is then placed on the coated phenol resin. Next, the press sheet on the phenol resin is pressed by a roller so that the phenol resin is extended uniformly over one side of the insulating tape layer 102. Thereafter, the press sheet is removed from the phenol resin to form the adhesive sheet 103' having a uniform thickness of about 20 $\mu$m.

Figure 3B:
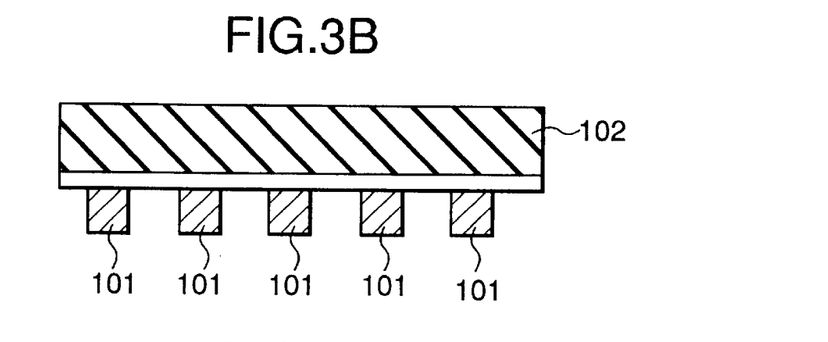

Next, as shown in FIG. 3B, the leads 101 is attached to the adhesive sheet 103'. The spacing between the leads 101 is set to about 0.15 mm. Next, the adhesive sheet 103' is selectively etched with a wet etching method using these leads 101 as an etching mask. This wet etching is performed in an organic solvent such as a methyl ethyl keton (MEK) solvent and an acetone solvent. In this way, the respective isolated adhesive islands 103a are formed between the leads 101 and the insulating tape layer 102 as shown in FIG. 3C.

Note that the adhesive sheet 103' may be selectively etched with a dry etching method. In such a case the adhesive sheet 103' is formed to a film thickness of about 10 $\mu$m.

Figure 3C:
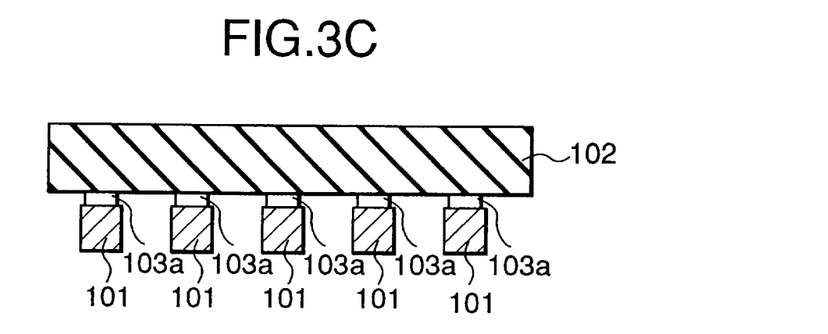
Figure 3D:
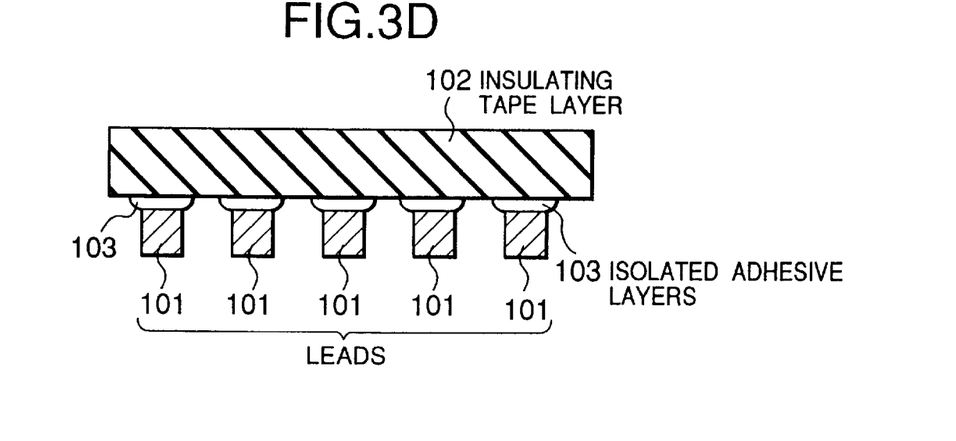

Subsequently, the lead frame in the state of FIG. 3C is thermally processed in a furnace at about 150 degrees centigrade in an atmosphere of air or nitrogen gas. In the thermal process, as shown in FIG. 3D, the isolated adhesive islands 103a are thermally set and each adhesive region is expanded, whereby the isolated adhesive layers 103 are formed. In the aforementioned way, the leads 101 are fixed to the insulating tape layer 102 through the isolated adhesive layers 103 each being formed in the shape of an island.

Figure 4A:
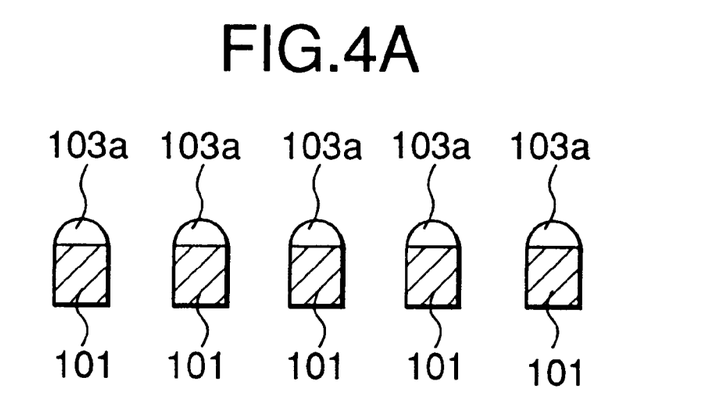
FIGS. 4A through 4C are sectional views used to explain how the lead frame according to the first embodiment of the present invention is fabricated in accordance with a second fabrication method.
Figure 4B:
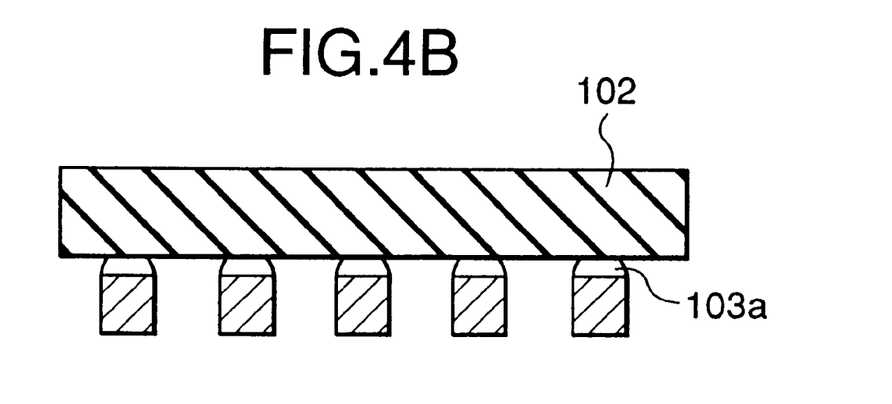
Figure 4C:
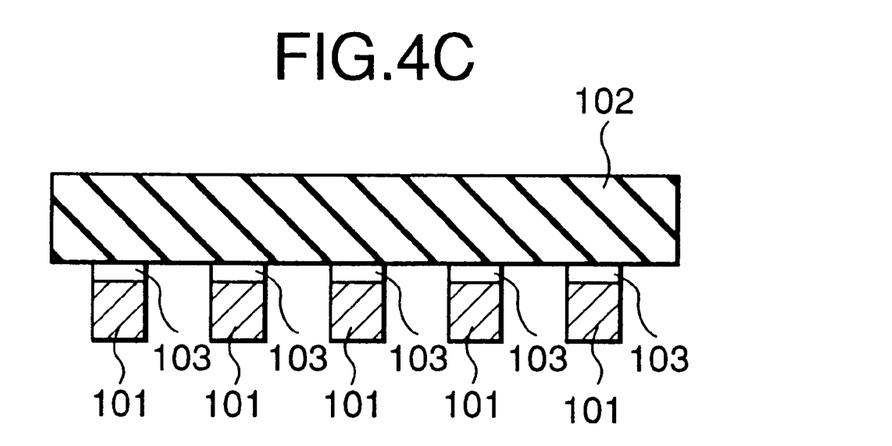

As shown in FIGS. 4A–4C, another fabrication method may be employed to form the taped lead frame fixed by the isolated adhesive layers 103.

Referring to FIG. 4A, adhesive layers 103a are previously formed on the leads 101, respectively. These adhesive layers 103a are applied to the leads 101 by means of a print-brush.

Subsequently, as shown in FIG. 4B, an insulating tape layer 102 is attached to the leads 101 through the isolated adhesive layers 103a. In this example, the spacing between the leads 101 is set to about 0.1 mm.

Thereafter, the lead frame in the state of FIG. 4B is thermally processed in a furnace. The processing temperature is about 200 degrees centigrade and the processing atmosphere is nitrogen gas. In the thermal process, the isolated adhesive layers 103a are thermally set and each fixing region is expanded, whereby isolated adhesive layers 103 are formed. In the aforementioned way, the leads 101 are bonded to the insulating tape layer 102 through the isolated adhesive layers 103 each being formed in the shape of an island.

In the case of the aforementioned second fabrication method, the isolated adhesive layer 103a is formed on a portion of the surface of the lead 101. For this reason, the area of the isolated adhesive layer 103 which bonds the lead 1 and the insulating tape layer 102 together can be set so as to be smaller. Consequently, the lead spacing becomes smaller.

Figure 5A:
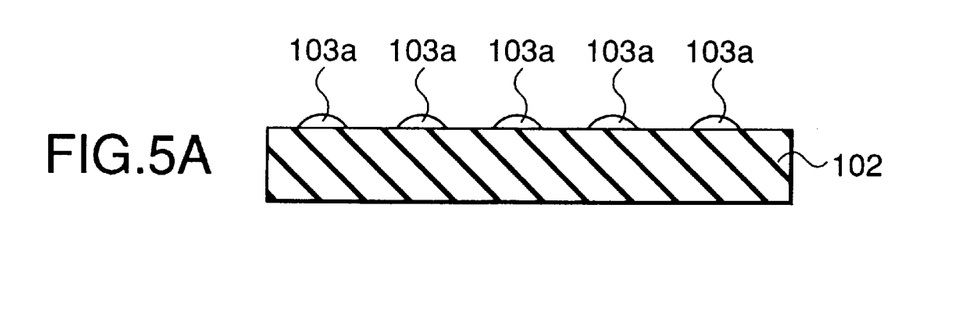
FIGS. 5A through 5C are sectional views used to explain how the lead frame according to the first embodiment of the present invention is fabricated in accordance with a third fabrication method.
Figure 5B:
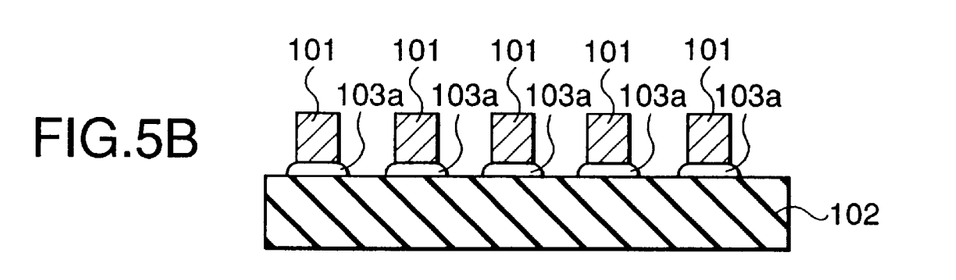
Figure 5C:
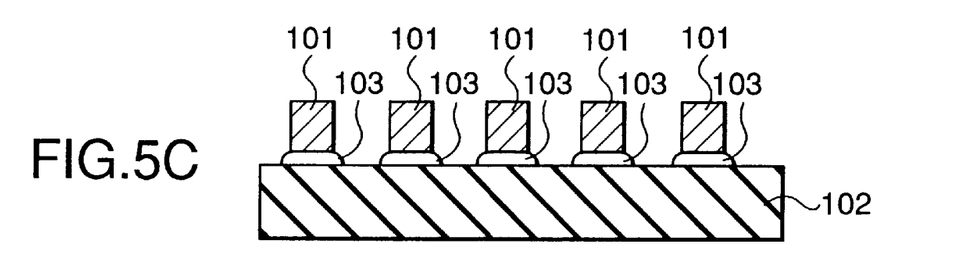

FIGS. 5A–5C show a third fabrication method of the taped lead frame. Referring to FIG. 5A, adhesive islands 103a are previously formed on one side of an insulating tape layer 102. These adhesive islands 103a are formed by a nozzle applying adhesive material to predetermined regions of the insulating tape layer 102 to which the leads 101 are to be bonded.

Next, as shown in FIG. 5B, the insulating tape layer 102 having the isolated adhesive islands 103a formed thereon is attached to the leads 101. Here, the spacing between the leads 101 is set to about 0.2 mm.

Thereafter, the lead frame in the state of FIG. 5B is thermally processed in a furnace at about 100 degrees centigrade in an atmosphere of nitrogen gas. In the thermal process, the isolated adhesive layers 103a are thermally set and each bonding region is expanded, whereby isolated adhesive layers 103 are formed as shown in FIG. 5C. In the aforementioned way, the leads 101 are bonded to the insulating tape layer 2 through the isolated adhesive layers 103 each being formed in the shape of an island.

SECOND EMBODIMENT

A second embodiment of the present invention will hereinafter be described in reference to FIGS. 6A and 6B.

Figure 6A:
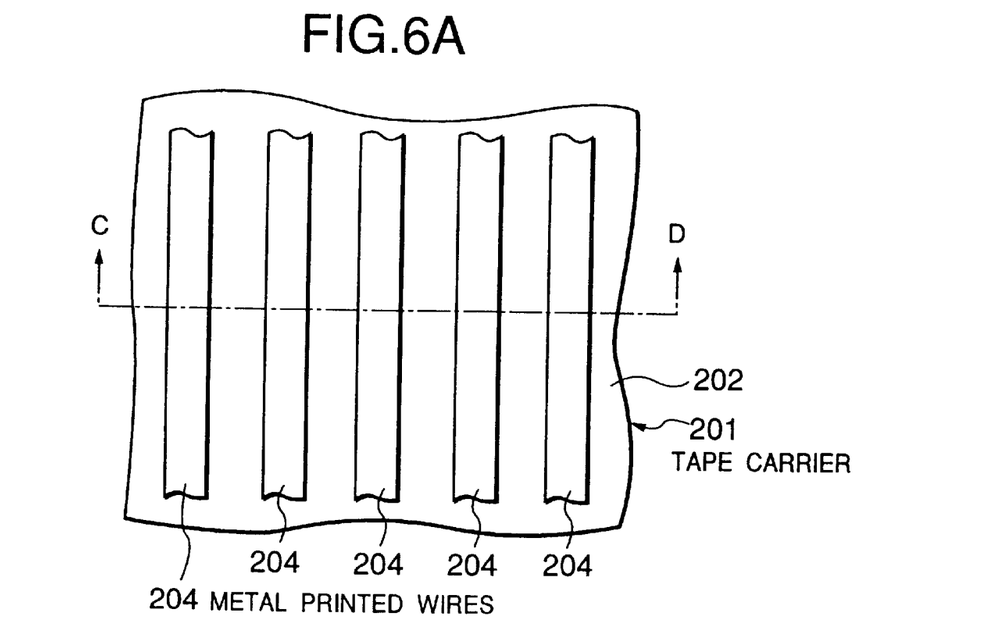
FIG. 6A is a plan view showing a tape carrier according to a second embodiment of the present invention.
Figure 6B:
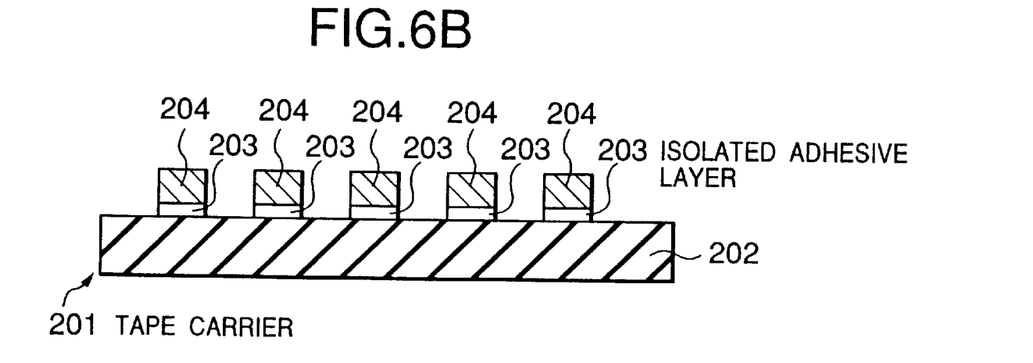
FIG. 6B is a sectional view of the tape carrier in FIG. 6A taken substantially along line C–D of FIG. 6A.

As shown in FIGS. 6A and 6B, a tape carrier 201 which is used for tape automated bonding (TAB) is composed of an insulating tape 202 bonded lo printed wires 204 through adhesive layers 203 isolated from each other. The printed wire material is copper (Cu) and the spacing between the printed wires 204 is about 50 $\mu$m. The insulating tape layer 202, as with prior art, is an organic insulator such as polyimide.

Thus, the printed wires 204 of the tape carrier 201 shown in FIG. 6B are respectively bonded to the insulating tape layer 202 through isolated adhesive layers 203 each formed in the shape of an island in correspondence with the respective printed wires 204. The adhesive layers 203 are made of imide base resin. In this embodiment, as with the first embodiment, the contact between the printed wires is also prevented.

Figure 7A:
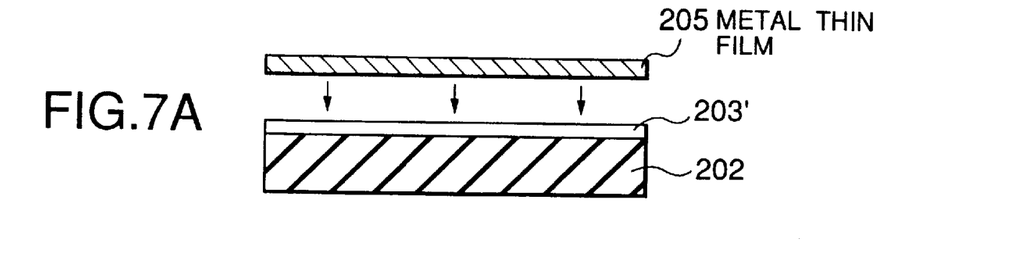
FIGS. 7A through 7E are sectional views used to explain how the tape carrier according to the second embodiment of the present invention is fabricated.

As shown in FIGS. 7A–7E, the tape carrier 201 as shown in FIGS. 6A and 6b is fabricated. Referring to FIG. 7A, an adhesive sheet 203' is formed on one side of the insulating tape layer 202. In this embodiment, the adhesive sheet 203' is imide base resin with a film thickness of about 10 $\mu$m and is formed as follows. That is, a coating of imide base resin is applied over one side of the insulating tape layer 202 of polyimide. A press sheet is then placed on the applied imide base resin. Next, the press sheet on the imide base resin is pressed by a roller so that the imide base resin is uniformly extended. Thereafter, the press sheet is removed from the imide base resin to form the adhesive sheet 203'. Subsequently, a thin metal film 205 is attached to the adhesive sheet 203'. This thin metal film 205 may be made of copper (Cu).

Figure 7B:
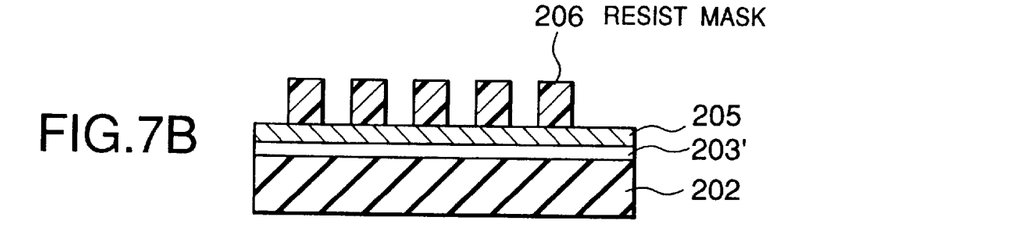

Next, as shown in FIG. 7B, a photoresist mask 206 is formed on the thin metal film 205 by means of photo lithography. The pattern width of this photoresist mask 206 is set to about 50 μm. The photoresist mask 206 is formed from a photosensitive polyimide film.

Figure 7C:
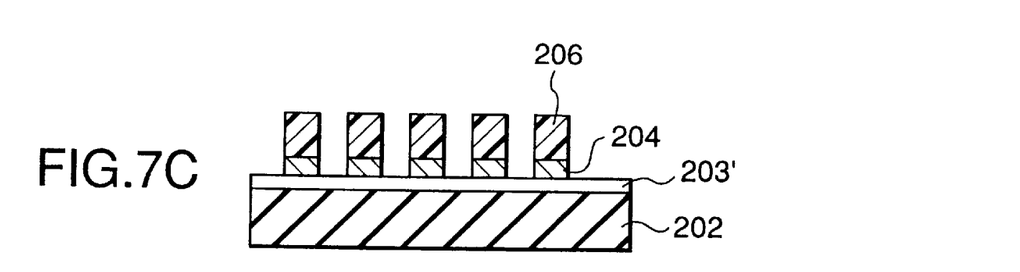
Figure 7D:
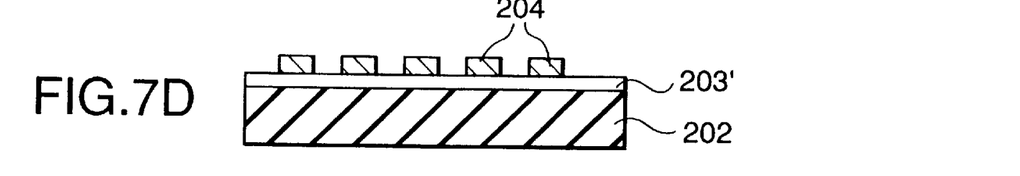

As shown in FIG. 7C, the thin metal film 205 is selectively etched with a wet etching method using the photoresist mask 206 as an etching mask, and the printed wires 204 are formed. This wet etching is performed using an etchant such as aqua regia. Then, as shown in FIG. 7D, the photoresist mask 206 is removed by ashing or with an organic solvent.

Figure 7E:
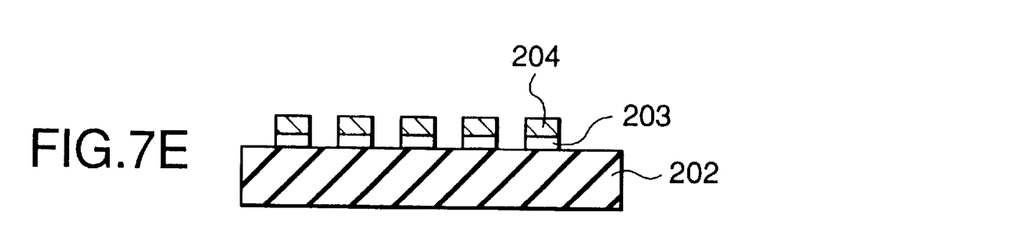

Next, the adhesive sheet 203' is selectively etched with an organic solvent by using the printed wire 204 as an etching mask. Then, thermal processing is performed in a furnace. The processing temperature is about 300 degrees centigrade and the processing atmosphere is nitrogen gas. In the thermal process, as shown in FIG. 7E, the printed wires 204 are bonded to the insulating tape layer 202 through the isolated adhesive layers 203 that are formed in the shape of an island, respectively.

THIRD EMBODIMENT

Figure 8:
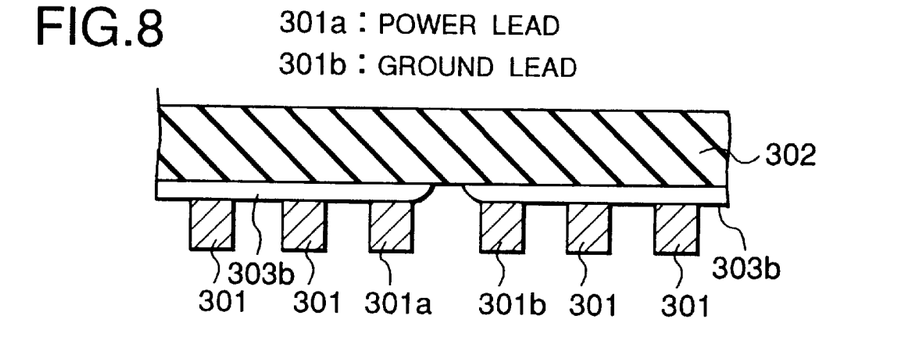
FIG. 8 is a sectional view showing an example of a lead frame constructed in accordance with a third embodiment of the present invention.

As illustrated in FIG. 8, a power lead 301a and a ground lead 301b of a lead frame are formed so as to be adjacent to each other. Other leads 301 of the lead frame are used to transfer signals, for example, clock signals that are used in the integrated circuit.

The power lead 301a, the ground lead 301b, and the clock signal leads 301 are bonded to an insulating tape layer 302 through adhesive layers 303b. Specifically, the adhesive layers 303b are spatially separated on the insulating tape layer 302 between the power lead 301a and the ground lead 301b. In other words, one adhesive layer 303b bonding the power lead 301a is separated from the other adhesive layer 303b bonding the ground lead 301b. Note that the lead material is copper (Cu) plated with Ag or an alloy plated with Ag. The lead spacing between the power lead 301a and the ground lead 301b is set to about 0.15 mm, while the lead spacing between the signal leads 301 is set so as to be narrower, for example, 0.1 mm. The reason why the spacing between the power lead 301a and the ground lead 301b is wider than that between signal leads 301 is for rendering it easy to selectively etch the adhesive layer 303b between the power lead 301a and the ground lead 301b and further for ensuring sufficient insulation between the power lead 301a and the ground lead 301b. At the area where removal of the adhesive layer 303b is not needed, the lead spacing is made narrower so that many pins can be provided.

With respect to migration life, a comparison has been made between the aforementioned lead frame of the present invention and the conventional lead frame shown in FIGS. 1A and 1B, and the following fact has been found. That is, at an acceleration test, the migration life of the embodiment of the present invention is more than 100 times that of the conventional case. For the conditions of the acceleration test, the atmosphere temperature was set to 140 degrees centigrade and the atmosphere humidity to 85%. Also, the applied voltage of the power lead was set to a dc voltage of 6 V, and the voltage of the signal lead was set to an ac voltage of 6 V.

The aforementioned fact indicates that, if only the adhesive layer between the leads 301a and 301b (to which dc voltage is applied) is removed, a prolongation in the life of the lead frame will be possible and the long-term reliability will be effectively enhanced.

Figure 9:
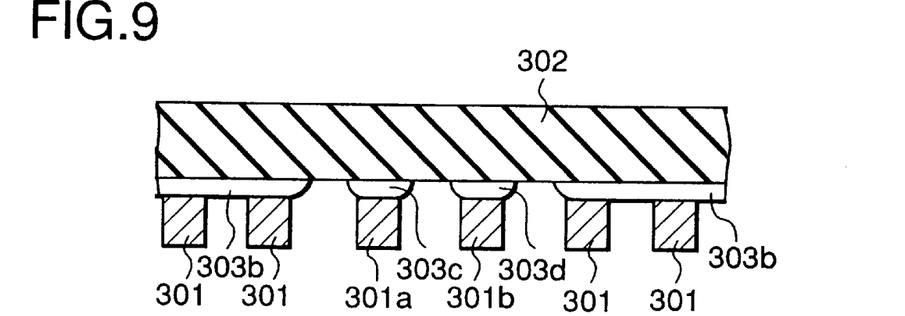
FIG. 9 is a sectional view showing another example of the lead frame shown in FIG. 8.

FIG. 9 illustrates another example of the third embodiment of the present invention. As previously described in the embodiment shown in FIG. 8, the power lead 301a and the ground lead 301b of the lead frame are formed so as to be adjacent to each other. Other leads 301 of the lead frame are employed, for example, as clock signal leads that are used in ICs.

The power lead 301a and the ground lead 301b are bonded to the insulating tape layer 302 through isolated adhesive layers 303c and 303d, respectively. The clock signal leads 301 are bonded to the insulating tape layer 302 through the adhesive layers 303b. The lead material is copper (Cu) plated with Ag or an alloy plated with Ag. The lead spacing between the power lead 301a and the ground lead 301b is set to about 0.15 mm, while the lead spacing between the signal leads 301 adjacent to the power lead 301a or the ground lead 301b is set so as to be narrower, for example, 0.1 mm. The difference in the lead spacing is for the same reason as the embodiment of FIG. 8.

This arrangement has advantages similar to or higher than that of the embodiment shown in FIG. 8 More specifically, in the case where, among a plurality of leads, the power lead and the ground lead are adjacent to each other, an electric field in a fixed direction is always generated between these two leads. For this reason, in this case, an ion migration will most easily come to occur and the life till short circuit failure will be shortened. On the other hand, with respect to the other signal leads, an electric potential varies at all times, and consequently, it will be difficult for a fixed electric potential to occur between leads, and the life till short circuit failure due to ion migration becomes longer.

FOURTH EMBODIMENT

The case where an adhesive layer between a power lead and a ground lead is removed along with an insulating tape, which is a forth embodiment of the present invention, will hereinafter be described in reference to FIGS. 10, 11A, and 11B.

Figure 10:
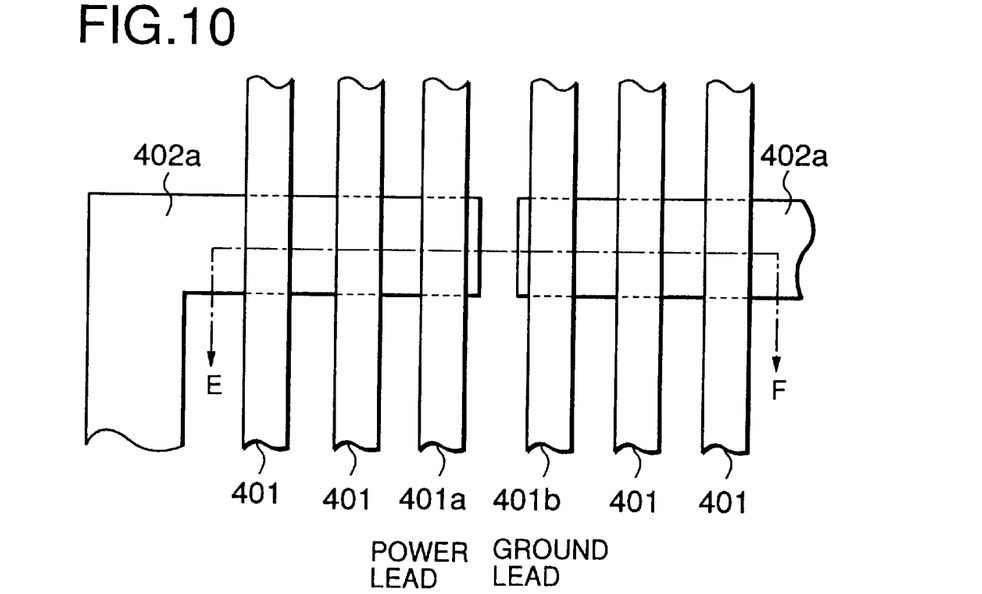
FIG. 10 is a plan view showing a lead frame according to a fourth embodiment of the present invention.
Figure 11A:
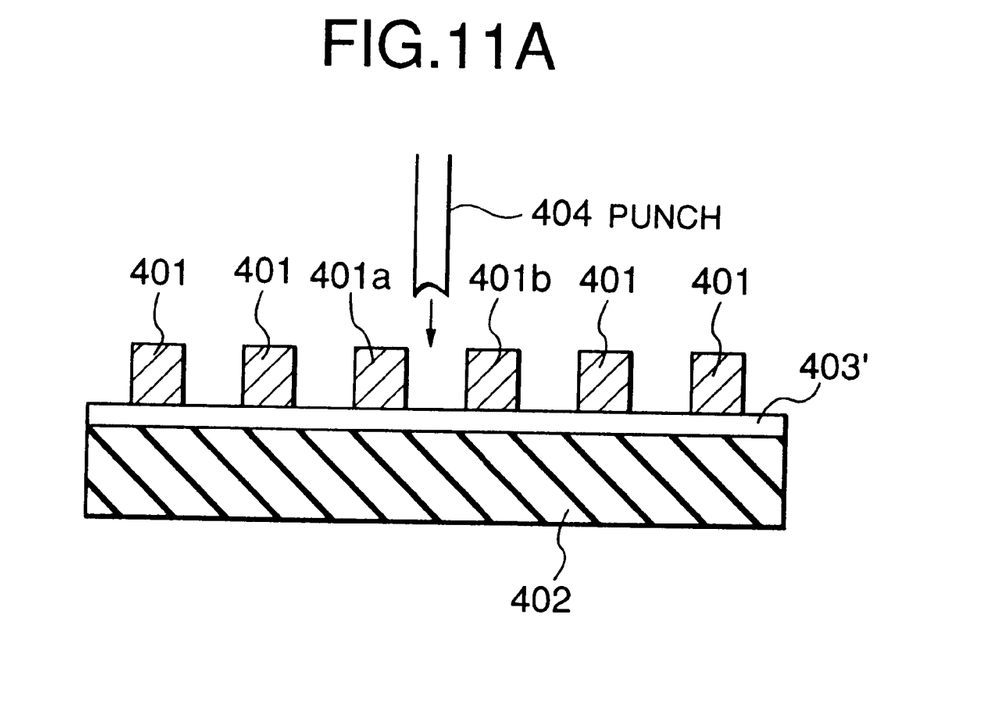
FIGS. 11A and 11B are sectional views used to explain how the lead frame according to the fourth embodiment of the present invention is fabricated
Figure 11B:
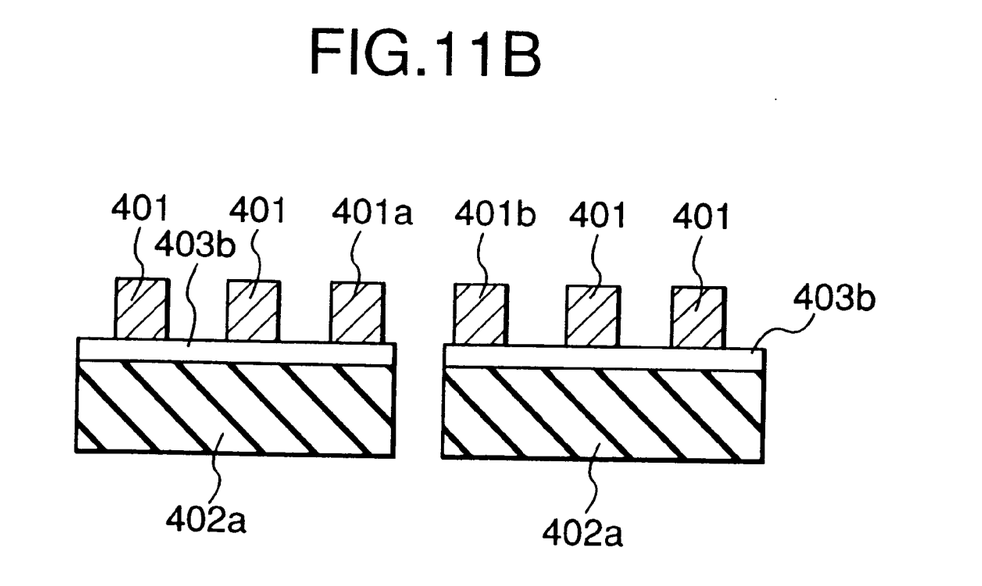

As shown in FIG. 10, a power lead 401a and a ground lead 401b are provided so as to be adjacent to each other. Then, the power lead 401a and the ground lead 401b are bonded to insulating tape layers 402a through adhesive layers, respectively. The insulating tape layers 402a are separated from each other between the power lead 401a and the ground lead 401b. If done in this way, this embodiment, as with the two embodiments shown in FIGS. 8 and 9, will have the advantage that a prolongation in the life of the lead frame will be possible and that the long-term reliability will be further enhanced.

The separate tape layers 402a are fabricated as follows. As shown in FIG. 11A, the power lead 401a and the ground lead 401b are provided so as to be adjacent to each other. Then, the power lead 401a, the ground lead 401b, and the signal leads 401 are bonded to an insulating tape layer 402 through an adhesive sheet 403'. The adhesive sheet 403' is severed between the power lead 401a and the ground lead 401b by means of a punch 404. Consequently, both the adhesive layer 403' and the insulating tape layer 402 are removed between the power lead 401a and the ground lead 401b, as shown in FIG. 11B.

The lead spacing between the power lead 401a and the ground lead 401b is set to about 0.15 mm, while the lead spacing between the signal leads 401 is set so as to be narrower, for example, 0.1 mm. With this arrangement, the punch 404 can be easily inserted between the power lead 401a and the ground lead 401b. In this case, removal of the adhesive layer and the insulating tape layer is simple, the removing step is short, and the fabrication cost is considerably reduced.

The lead taping is originally provided for the purpose of fixing leads and preventing adjacent leads from contacting each other. A pair of adjacent power and ground leads usually exist on one edge of the package. For this reason, a severed portion will be formed at a single place on one edge. Hence, even if an insulating tape layer were removed at a single place between a power lead and a ground lead, the problem of contact between leads would not arise.

The methods as described in the third embodiment and the fourth embodiment, are also applicable to a semiconductor device having a TAB structure (shown in FIGS. 6A and 6B) in the same way. in such a case, the leads in the aforementioned embodiments are replaced with printed wires, the power lead is replaced with a printed wire for power supply, and the ground lead is replaced with a printed wire for grounding. Even in this case, similar advantages as those of the aforementioned embodiments are obtainable.

As has been described above, the lead taping method and the TAB method according to the present invention are performed so that leads or printed wires are bonded to an insulating tape layer through adhesive layers and that no adhesive layer is formed between adjacent leads or between adjacent printed wires. For this reason, a phenomenon where copper (Cu) migrates through the adhesive layer interposed between adjacent leads or between adjacent printed wires, that is, a phenomenon called a Cu-ion migration can be completely suppressed between adjacent leads or between adjacent printed wires. Consequently, there is no occurrence of the aforementioned short circuit and leakage current between leads or between printed wires.

In addition, in the IC package of the resin seal type where a semiconductor chip is mounted on a lead frame or on a TAB tape carrier, the adhesion of molded resin to an insulting tape layer (or a tape carrier) is considerably enhanced.

In the case where, among a plurality of leads, the power lead and the ground lead are adjacent to each other, an electric field in a fixed direction is always generated between the two leads. For this reason, it is very effective to selectively remove an adhesive layer between the power lead and the ground lead. In this case, since the adhesive layer can be easily removed along with the insulating tape layer by means of a punch, the removing step is shortened and the fabrication cost is considerably reduced. These advantages are likewise obtainable even in the case of the removal of the adhesive layer between a printed wire for power supply and a printed wire for grounding.

Finally, in the case where a method of expanding only the spacing between a power lead and a ground lead and narrowing the spacing between other leads is employed as a method which meets the narrow lead pitch requirement, the aforementioned two methods are employed together. If done in this way, the compatibility between a prolongation in the life of the lead frame (or the tape carrier) till short circuit failure and a reduction in fabrication cost becomes easy. In this way, semiconductor devices with high reliability can be formed and the fabrication method can be precisely controlled.

What is claimed is:

1. A lead structure for chip connection, comprising:
   an insulating film;
   a plurality of leads having a predetermined pattern; and
   a plurality of adhesive layers separately provided on the insulating film, two adjacent leads being fixed by a different one of the adhesive layers, respectively, such that an adhesive does not exist on the insulating film between the adjacent leads.

2. The lead structure according to claim 1, wherein the adhesive layers are separately provided on the insulating film in a pattern corresponding to the predetermined pattern, the adhesive layers fixing the leads, respectively.

3. The lead structure according to claim 1, wherein the adhesive layers comprises two adjacent adhesive layers and the leads comprise two group of leads which are fixed by the two adjacent adhesive layers, respectively.

4. The lead structure according to claim 3, wherein a first lead and a second lead which are adjacent to each other are fixed by the two adjacent adhesive layers, respectively.

5. The lead structure according to claim 4, wherein a DC (direct current) voltage difference exists between the first and second leads.

6. The lead structure according to claim 5, wherein a power supply voltage is applied to the first lead and a ground voltage is applied to the second lead.

7. A lead structure for chip connection, comprising:
   an insulating film,;
   a plurality of leads having a predetermined pattern; and
   a plurality of adhesive layers separately provided on the insulating film, two adjacent leads being fixed by adjacent adhesive layers respectively, such that an adhesive does not exist on the insulating film between the adjacent adhesive layers;
   wherein the adhesive layers include a first and second adhesive layers which are adjacent to each other and further include a third adhesive layer adjacent to the first adhesive layer and a fourth adhesive layer adjacent to the second adhesive layer; and
   the leads include first and second leads with are adjacent to each other and further include two group of leads other than the first and second leads, the first and second leads being fixed by the first and second adhesive layers, respectively, and the two group of leads being fixed by the third and fourth adhesive layers, respectively.

8. The lead structure according to claim 7, wherein a DC (direct current) voltage difference exists between the first and second leads.

9. The lead structure according to claim 8, wherein a power supply voltage is applied to the first lead and a ground voltage is applied to the second lead.

10. The lead structure according to claim 2, wherein the leads include a first lead and a second lead which are adjacent to each other, a DC (direct current) voltage difference exists between the first and second leads.

11. The lead structure according to claim 10, wherein a power supply voltage is applied to the first lead and a ground voltage is applied to the second lead.

12. The lead structure according to claim 3, wherein
   the insulating film comprises a first insulating film and a second insulating film which are spatially separated from each other; and
   the two adjacent adhesive layers are provided on the first and second insulating films, respectively.

13. A lead frame for chip sealing, comprising:
   an insulating tape;
   a plurality of leads having a predetermined pattern; and
   a plurality of adhesive layers separately provided on the insulating tape, two adjacent leads being fixed by a different one of the adhesive layers, respectively, such that an adhesive does not exist on the insulating tape between the adjacent leads.

14. A tape carrier for TAB, comprising:

an insulating tape;

a plurality of leads having a predetermined pattern; and a plurality of adhesive layers separately provided on the insulating tape, two adjacent leads being fixed by a different one of the adhesive layers, respectively, such that an adhesive does not exist on the insulating tape between the adjacent leads.

15. A semiconductor chip package comprising a semiconductor chip and a lead structure, wherein the lead structure comprises:

an insulating film;

a plurality of leads which are electrically connected to the semiconductor chip; and a plurality of adhesive layers separately provided on the insulating film, two adjacent leads being fixed by a different one of the adhesive layers, respectively, such that an adhesive does not exist on the insulating film between the adjacent leads.

16. The semiconductor chip package according to claim 15, wherein the lead structure is a lead frame.

17. The semiconductor chip package according to claim 15, wherein the lead structure is a tape carrier for TAB.

* * * * *